(12) United States Patent
Ryu

(10) Patent No.: US 7,868,992 B2
(45) Date of Patent: Jan. 11, 2011

(54) LIQUID CRYSTAL DISPLAY DEVICE HAVING PATTERNED SPACERS AND METHOD OF FABRICATING THE SAME

(75) Inventor: Sang-Chul Ryu, Gyeongsangbuk-do (KR)

(73) Assignee: LG Display Co., Ltd., Seoul (KR)

( * ) Notice: Subject to any disclaimer, the term of this patent is extended or adjusted under 35 U.S.C. 154(b) by 575 days.

(21) Appl. No.: 10/999,004

(22) Filed: Nov. 30, 2004

(65) Prior Publication Data

US 2005/0243247 A1    Nov. 3, 2005

(30) Foreign Application Priority Data

Apr. 30, 2004    (KR) .................... 10-2004-0030590

(51) Int. Cl.
  *G02F 1/1339* (2006.01)
  *G02F 1/1335* (2006.01)
(52) U.S. Cl. .................... 349/155; 349/106; 349/122
(58) Field of Classification Search ................ 349/106, 349/156, 155, 187, 122
  See application file for complete search history.

(56) References Cited

U.S. PATENT DOCUMENTS

| | | | |
|---|---|---|---|
| 6,281,960 B1 * | 8/2001 | Kishimoto et al. | 349/156 |
| 6,583,846 B1 * | 6/2003 | Yanagawa et al. | 349/155 |
| 6,909,478 B2 * | 6/2005 | Ichihashi et al. | 349/106 |
| 7,123,333 B2 * | 10/2006 | Lee et al. | 349/156 |
| 2002/0075441 A1 * | 6/2002 | Fujimori et al. | 349/155 |
| 2002/0130993 A1 | 9/2002 | Ichihashi et al. | 349/106 |
| 2003/0025868 A1 * | 2/2003 | Hiroshima et al. | 349/156 |
| 2003/0071956 A1 | 4/2003 | Sasaki et al. | 349/155 |
| 2003/0137632 A1 | 7/2003 | Kawabata | 349/156 |
| 2003/0214541 A1 * | 11/2003 | Jun et al. | 347/2 |
| 2004/0150763 A1 * | 8/2004 | Sakamoto et al. | 349/44 |
| 2004/0169810 A1 * | 9/2004 | Fujimori et al. | 349/156 |
| 2005/0088598 A1 * | 4/2005 | Matsumori et al. | 349/139 |
| 2005/0099580 A1 * | 5/2005 | Lee et al. | 349/156 |

FOREIGN PATENT DOCUMENTS

| | | |
|---|---|---|
| JP | 06-301040 | 10/1994 |
| JP | 06-318542 | 11/1994 |
| JP | 10-284375 | 10/1998 |
| JP | 2000-089233 | 3/2000 |
| JP | 2001-159755 | 6/2001 |
| JP | 2001-235754 | 8/2001 |
| JP | 2003-156751 | 5/2003 |

* cited by examiner

*Primary Examiner*—David Nelms
*Assistant Examiner*—Nathanael R Briggs
(74) *Attorney, Agent, or Firm*—Morgan Lewis & Bockius LLP

(57) ABSTRACT

A liquid crystal display device includes first and second substrates, a black matrix on the second substrate, the black matrix including a plurality of open portions corresponding to pixel regions and a plurality of holes disposed adjacent to the plurality of open portions, color filter layers on the black matrix, and a plurality of patterned spacers corresponding to each of the plurality of holes between the first and the second substrates.

6 Claims, 22 Drawing Sheets

LIQUID CRYSTAL DISPLAY DEVICE HAVING PATTERNED SPACERS AND METHOD OF FABRICATING THE SAME

The present invention claims the benefit of Korean Patent Application No. 2004-0030590, filed in Korea on Apr. 30, 2004, which is hereby incorporated by reference.

BACKGROUND OF THE INVENTION

1. Field of the Invention

The present invention relates to a liquid crystal display device, and more particularly to a liquid crystal device having patterned spacers and a method of fabricating the same.

2. Discussion of the Related Art

In general, a liquid crystal display (LCD) device makes use of optical anisotropy and polarization properties of liquid crystal molecules. The liquid crystal molecules have a definite orientational alignment that results from their long thin shape. The orientation of the liquid crystal molecules can be controlled by applying an electric field to the liquid crystal molecules. The orientation of the liquid crystal molecules changes in accordance with an intensity of the applied electric field. Incident light through a liquid crystal material is refracted due to an orientation of the liquid crystal molecules. Thus, an intensity of the incident light can be controlled and images can be displayed.

Among the various types of LCD devices commonly used, active matrix LCD (AM-LCD) devices have been developed because of their high resolution and superior display of moving images. In an active matrix LCD (AM-LCD) device, thin film transistors (TFTs) and pixel electrodes connected to the TFTs are disposed in a matrix configuration.

The LCD device includes upper and lower substrates, and a liquid crystal layer interposed therebetween. The upper substrate and lower substrate are commonly referred to as a color filter substrate and an array substrate, respectively. A common electrode and color filter layers are formed on the upper substrate. TFTs and pixel electrodes are formed on the lower substrate.

After forming the common electrode, the color filter layers, the TFTs and the pixel electrodes, the LCD device undergoes a liquid crystal cell process where a liquid crystal layer is formed between the upper and lower substrates. The liquid crystal cell process may be divided into a process of forming an alignment layer to align the liquid crystal molecules, a process of forming a cell gap, a process of attaching the color filter and array substrates together, a process of cutting the attached color filter and array substrates into cells, and a process of injecting the liquid crystal molecules. Accordingly, a liquid crystal display panel is fabricated using the liquid crystal cell process.

FIG. 1 is a schematic cross sectional view of a liquid crystal display device according to the related art. Referring to FIG. 1, a liquid crystal device includes upper and lower substrates 41 and 21 spaced apart from each other, and a liquid crystal layer 50 interposed therebetween. A gate line (not shown) and a data line (not shown) crossing the gate line are formed along an inner surface of the lower substrate 21, wherein a pixel region "P" is defined by crossings of the gate and data lines. A thin film transistor "Tr" is formed at the crossing portion of the gate and data lines. A pixel electrode 35 is formed in the pixel region "P" and is connected to the thin film transistor "Tr." The lower substrate 21, the gate and data lines, and the pixel electrode 35 constitute an array substrate 20. A black matrix 43 is formed along an inner surface of the upper substrate 41 in a boundary region of the pixel region "P" in order to prevent light leakage and to shield the thin film transistor "Tr" from incident light.

A color filter layer 45 includes red, green and blue filters 45a, 45b and 45c on the black matrix 43 in order to filter light having specific wavelengths. A common electrode 47 is formed on the color filter layer 45. Although not shown, each of red, green and blue sub-color filter 45a, 45b and 45c are located in each of the pixel regions "P," respectively. The upper substrate 41, the black matrix 43, the color filter layer 45 and the common layer 47 constitute a color filter substrate 40. In addition, the liquid crystal layer 50 is formed between the pixel electrode 35 and the common electrode 47, wherein an electric field is applied across the liquid crystal layer 50 through the pixel electrode 35 and the common electrode 47.

Ball spacers 52 are disposed between the pixel electrode 35 and the common electrode 47 to maintain the uniform cell gap along with a seal pattern (not shown). Although not shown, upper and lower alignment layers may be formed on the common electrode 47 and the pixel electrode 35, respectively, to align the liquid crystal molecules. Specifically, the ball spacers 52 may be made of an elastic material deformable under an applied external pressure. For example, the ball spacers 52 may be made of a glass fiber or an organic material. However, since the ball spacers 52 are randomly distributed between the upper and lower substrates 41 and 21, the quality of an alignment layer may be lowered due to movement of the ball spacers 52. In addition, light leakage may occur within regions adjacent to the ball spacers 52 due to an adsorption force between the liquid crystal molecules adjacent to the ball spacers 52. Moreover, a uniform cell gap may not be obtained in a large sized LCD device. Furthermore, since the ball spacers 52 are elastic and do not remain at a fixed position, a severe ripple phenomenon may occur when the LCD device is touched. Thus, superior display quality can not be obtained in the LCD device using the ball spacers 52 to maintain a uniform cell gap.

On the other hand, a uniform cell gap may be easily obtained using the patterned spacers since they are formed in a non-pixel region, thereby preventing light leakage and improving contrast ratio. In addition, the patterned spacers may be applied to an LCD device requiring a small cell gap due to precise control of the cell gap. Furthermore, since the patterned spacers are fixed, they may be easily applied to large sized LCD devices and the ripple phenomenon may be prevented when the LCD device is touched. Since the patterned spacers may be formed directly on the overcoat layer in an IPS-mode LCD device, reliability of the patterned spacers is improved.

FIGS. 2A to 2E are schematic cross sectional views of a substrate during a process for fabricating a color filter substrate of a liquid crystal display device according to the related art. Referring to FIG. 2A, a black matrix 63 having first to third sub-open portions 65a, 65b and 65c is formed on a substrate 60 in which the pixel regions "P" shown in FIG. 1 are defined. Each of the first to third sub-open portions 65a, 65b and 65c correspond to each of the pixel regions "P."

Referring to FIG. 2B, a red filter 66a is formed in the first sub-open portion 65a of the black matrix 63. Although not shown, the red color filter 66a may be formed through photolithographic processes using a negative-type color pigment, wherein a portion of the negative-type color pigment is exposed through a mask and remains as a pattern after a subsequent development step. Although not shown, the black matrix 63 is disposed in a periphery of each sub-color filter 65a, 65b or 65c as a single body in plan view.

Referring to FIG. 2C, green and blue filters 66b and 66c are sequentially formed in the second and third sub-open portions 65b and 65c of the black matrix 63, respectively. The green and blue filters 66b and 66c are formed using the same method adapted for the red filter 66a. The red, green and blue filters 66a, 66b and 66c constitute a color filter layer 66.

Referring to FIG. 2D, an overcoat layer 69, such as an organic material having excellent planarization properties, is formed on the color filter layer 66. Referring to FIG. 2E, a plurality of patterned spacers 72 having a pillar shape are formed on the overcoat layer 69 corresponding to the portion of the black matrix 63.

The process of forming color filter substrate having these patterned spacers 72 is completed through total five mask processes including the step of forming the black matrix 63, the step of forming the red sub-color filter 66a, the step of forming the green sub-color filter 66b, the step of forming the blue sub-color filter 66c, the step of forming the overcoat layer 69, and the step of forming the patterned spacer 72.

In the mask process for the color filter substrate of the liquid crystal display device according to the related art, a mask is very expensive. In addition, since the production cost is proportional to the number of masks, a large number of masks increases the production cost for forming the color filter substrate.

SUMMARY OF THE INVENTION

Accordingly, the present invention is directed to a liquid crystal display device having patterned spacers and a method of fabricating a liquid crystal display device having patterned spacers that substantially obviate one or more of the problems due to limitations and disadvantages of the related art.

An object of the present invention is to provide a liquid crystal display device having low manufacturing costs by using a small number of mask processes.

Another object of the present invention is to provide a method of fabricating a liquid crystal display device having low manufacturing costs by using a small number of mask processes.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a liquid crystal display device includes first and second substrates, a black matrix on the second substrate, the black matrix including a plurality of open portions corresponding to pixel regions and a plurality of holes disposed adjacent to the plurality of open portions, color filter layers on the black matrix, and a plurality of patterned spacers corresponding to the plurality of holes between the first and the second substrates.

In another aspect, a method of fabricating a liquid crystal display device having first and second substrates includes forming a black matrix having a plurality of open portions corresponding to pixel regions and a plurality of holes disposed adjacent to the plurality of open portions on the second substrate, forming color filter layers on the black matrix, and forming a plurality of patterned spacers corresponding to the plurality of holes by using the black matrix and the color filter layers as a mask.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Reference will now be made in detail to the illustrated embodiments of the present invention, examples of which are illustrated in the accompanying drawings.

Figure 1:
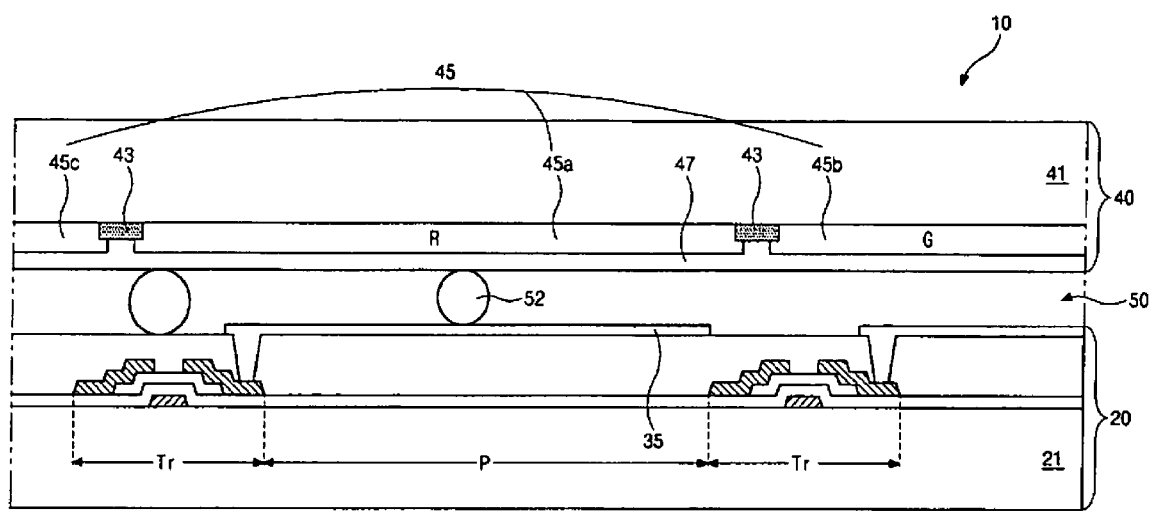
FIG. 1 is a schematic cross sectional view of a liquid crystal display device according to the related art.
Figure 2A:
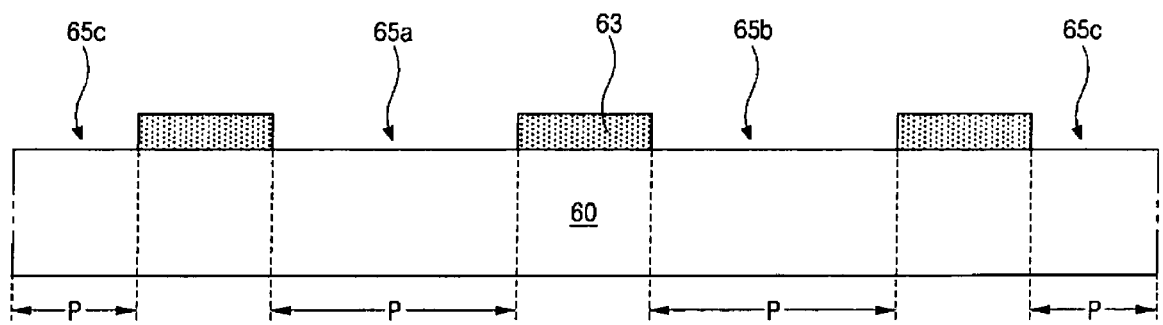
FIGS. 2A to 2E are schematic cross sectional views of a substrate during a process for fabricating a color filter substrate of a liquid crystal display device according to the related art.
Figure 2B:
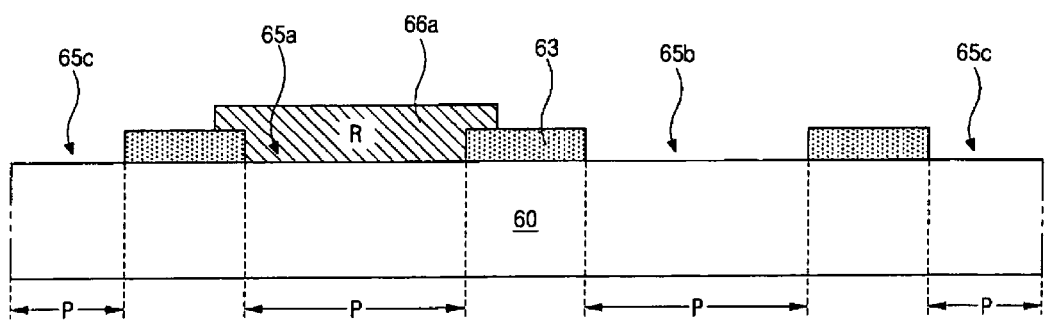
Figure 2C:
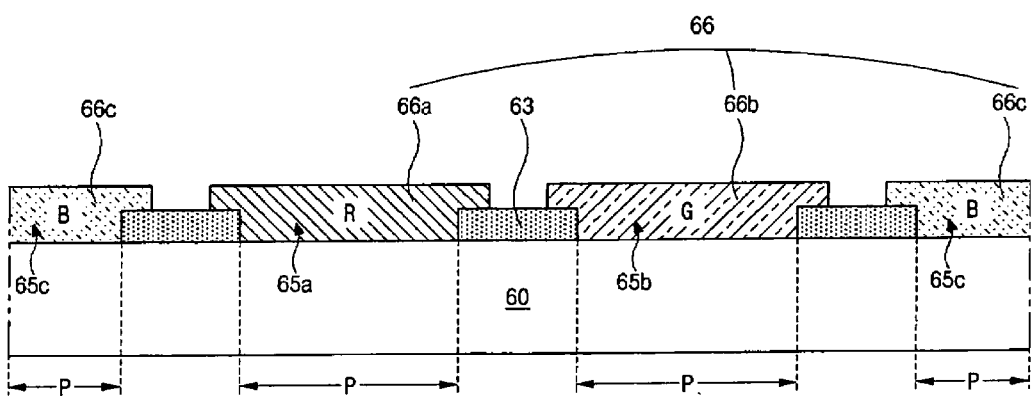
Figure 2D:
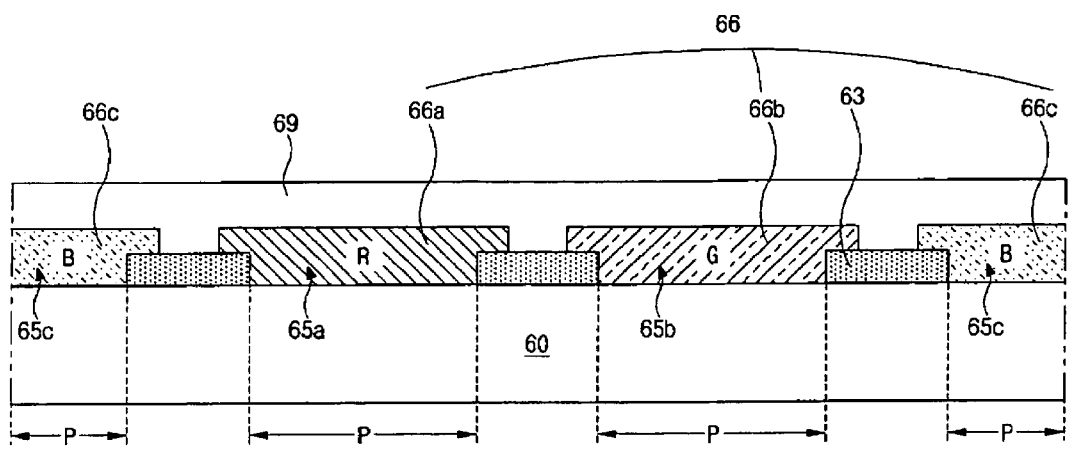
Figure 2E:
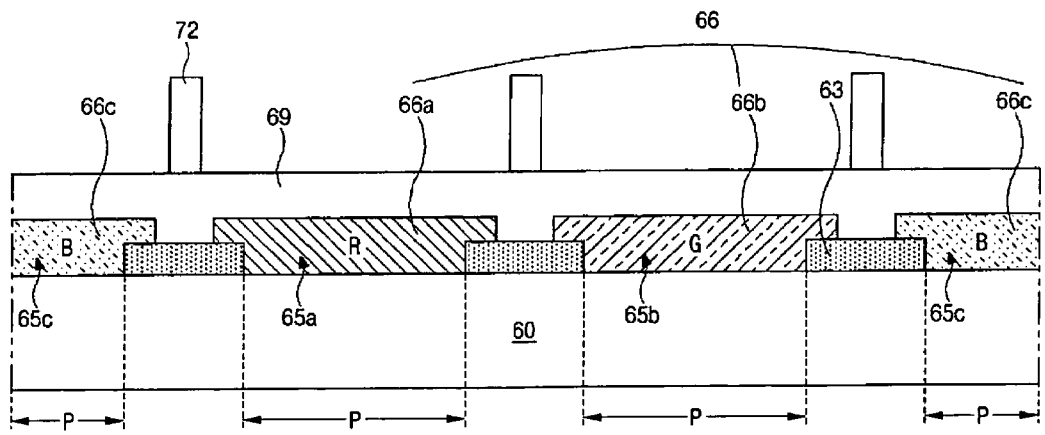
Figure 3A:
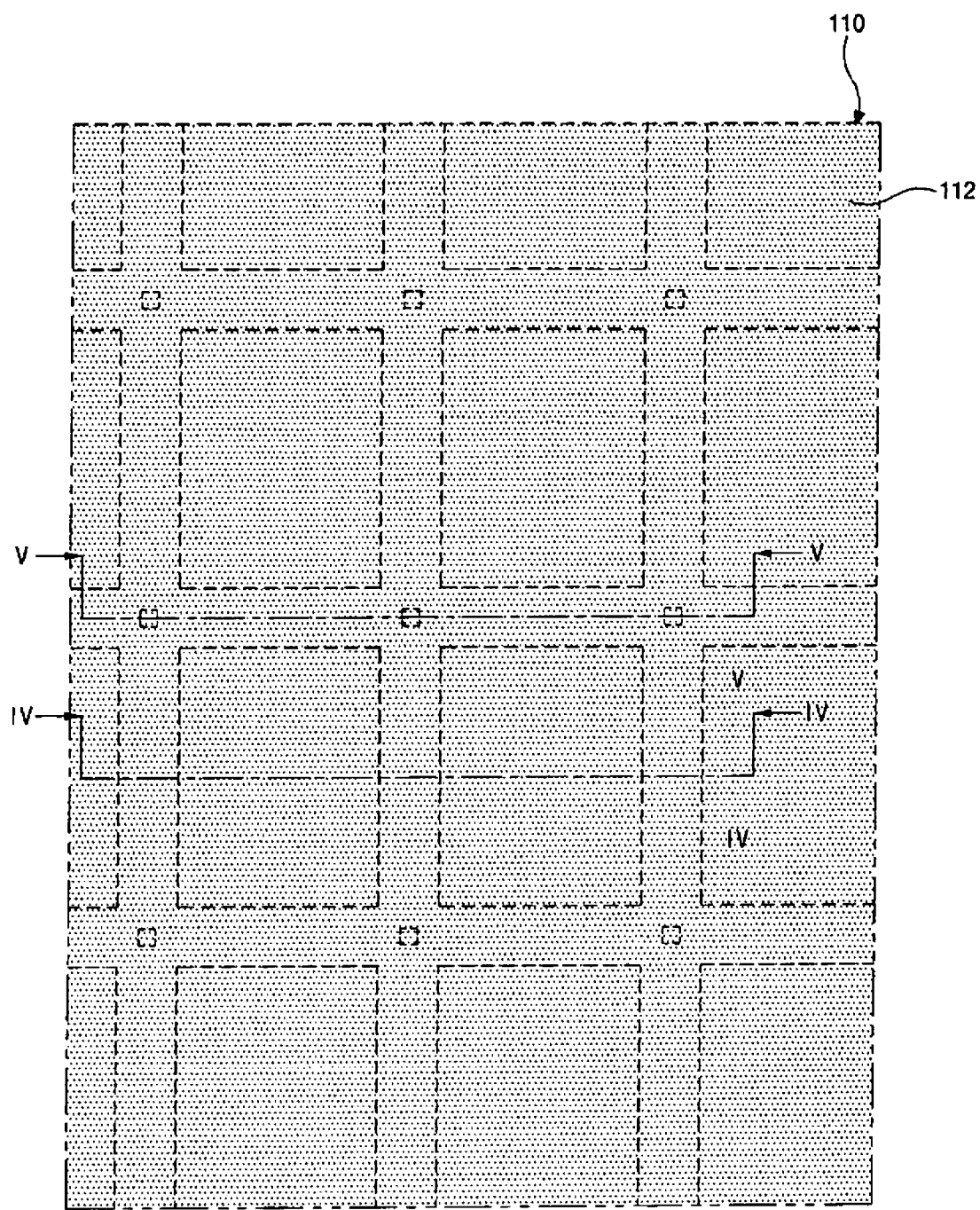
FIG. 3A is a plan view of an exemplary process for forming a black matrix layer on a substrate according to an embodiment of the present invention.
Figure 4A:
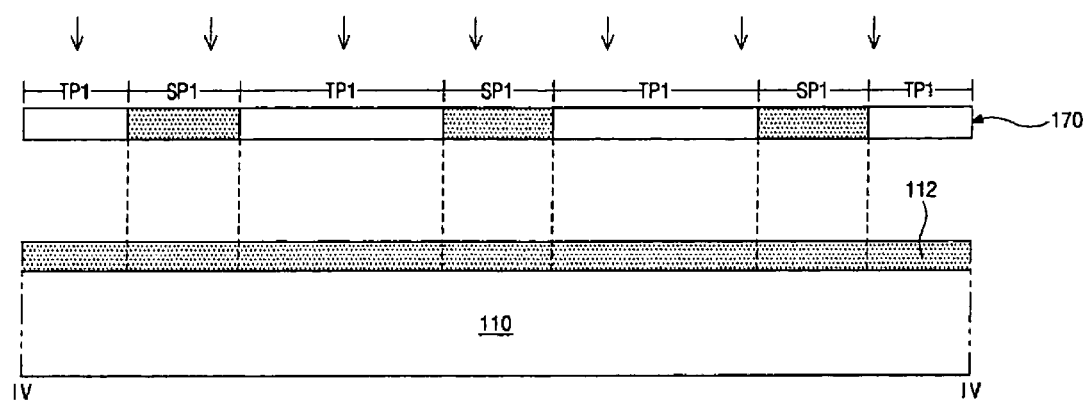
FIG. 4A is a cross-section view taken along a line "IV-IV" of FIG. 3A.
Figure 5A:
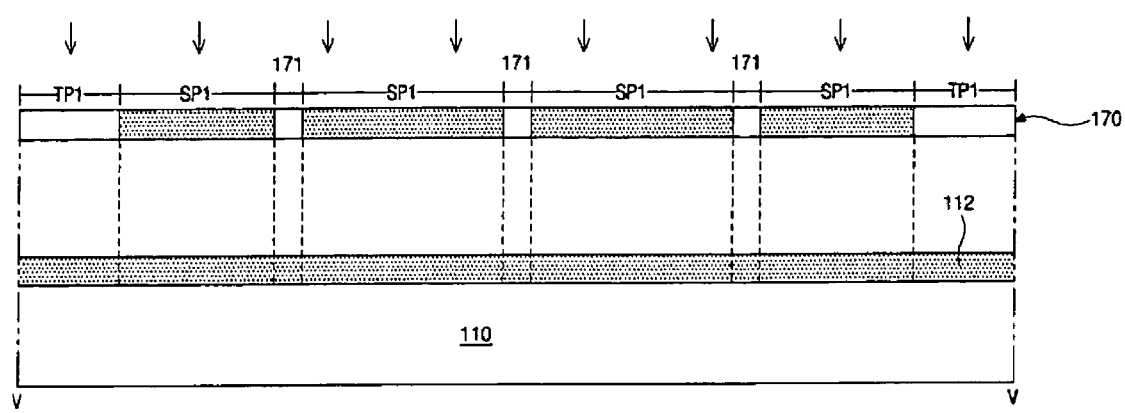
FIG. 5A is a cross-section view taken along a line "V-V" of FIG. 3A.

FIG. 3A is a plan view of an exemplary process for forming a black matrix layer on a substrate according to an embodiment of the present invention. FIG. 4A is a cross-section view taken along a line "IV-IV" of FIG. 3A. FIG. 5A is a cross-section view taken along a line "V-V" of FIG. 3A. Referring to FIGS. 3A, 4A and 5A, a photosensitive material having a light blocking property is coated on a substrate 110 to form a black matrix material layer 112 on the substrate 110. A mask 170 including a shielding portion "SP1" and a transmissive portion "TP1" is disposed over the substrate 110 having the black matrix material layer 112. An ultra-violet (UV) light is irradiated onto the substrate 110 through the mask 170. The black matrix material layer 112 may be selected from a black resin or an epoxy material. The mask 170 overlaps a region surrounded by a dotted line in FIG. 3A.

Figure 6A:
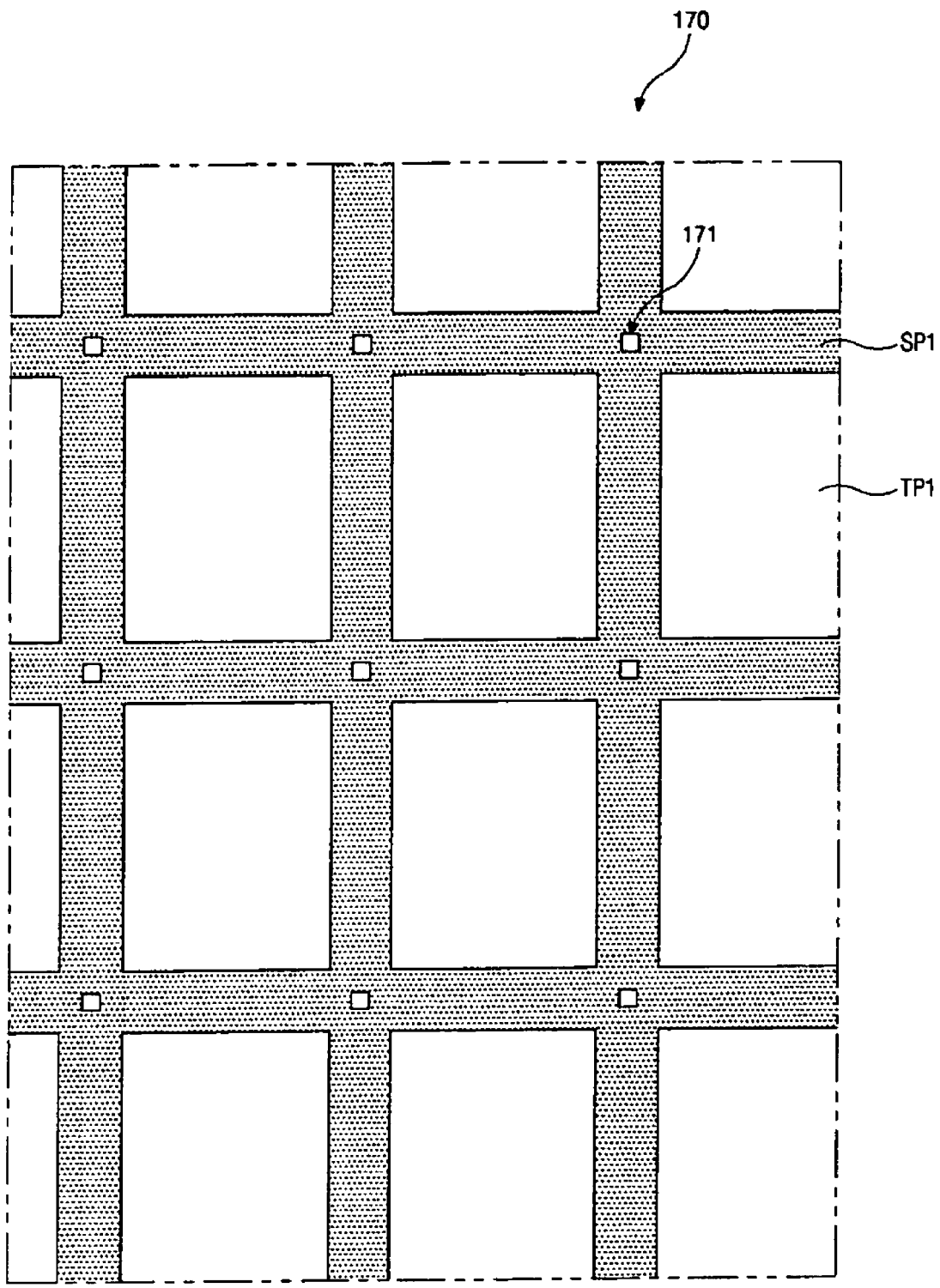
FIG. 6A is a plan view of an exemplary mask applied to a positive type photosensitive material according to an embodiment of the present invention.

FIG. 6A is a plan view of an exemplary mask applied to a positive type photosensitive material according to an embodiment of the present invention. In general, a positive type photosensitive material has a characteristic such that an exposed region of the positive type photosensitive material is removed through developing. The mask 170 exposes the black matrix material layer 112 (shown in FIG. 3A). The mask 170 includes a plurality of transmissive portions "TP1" and a shielding portion "SP1." The shielding portion "SP1" is located in a boundary region of the transmissive portions "TP1" as a single body as shown in FIG. 6A. The transmissive portion "TP1" can transmit the UV light and the shielding portion "SP1" can shield the UV light.

A plurality of transmissive holes 171 are located in the shielding portion "SP1." Specifically, the transmissive holes 171 are located in the shielding portion "SP1" at crossings of the transmissive portions "TP1." A design of the transmissive portions "TP1" and the transmissive holes 171 may be changed in any manner.

Figure 6B:
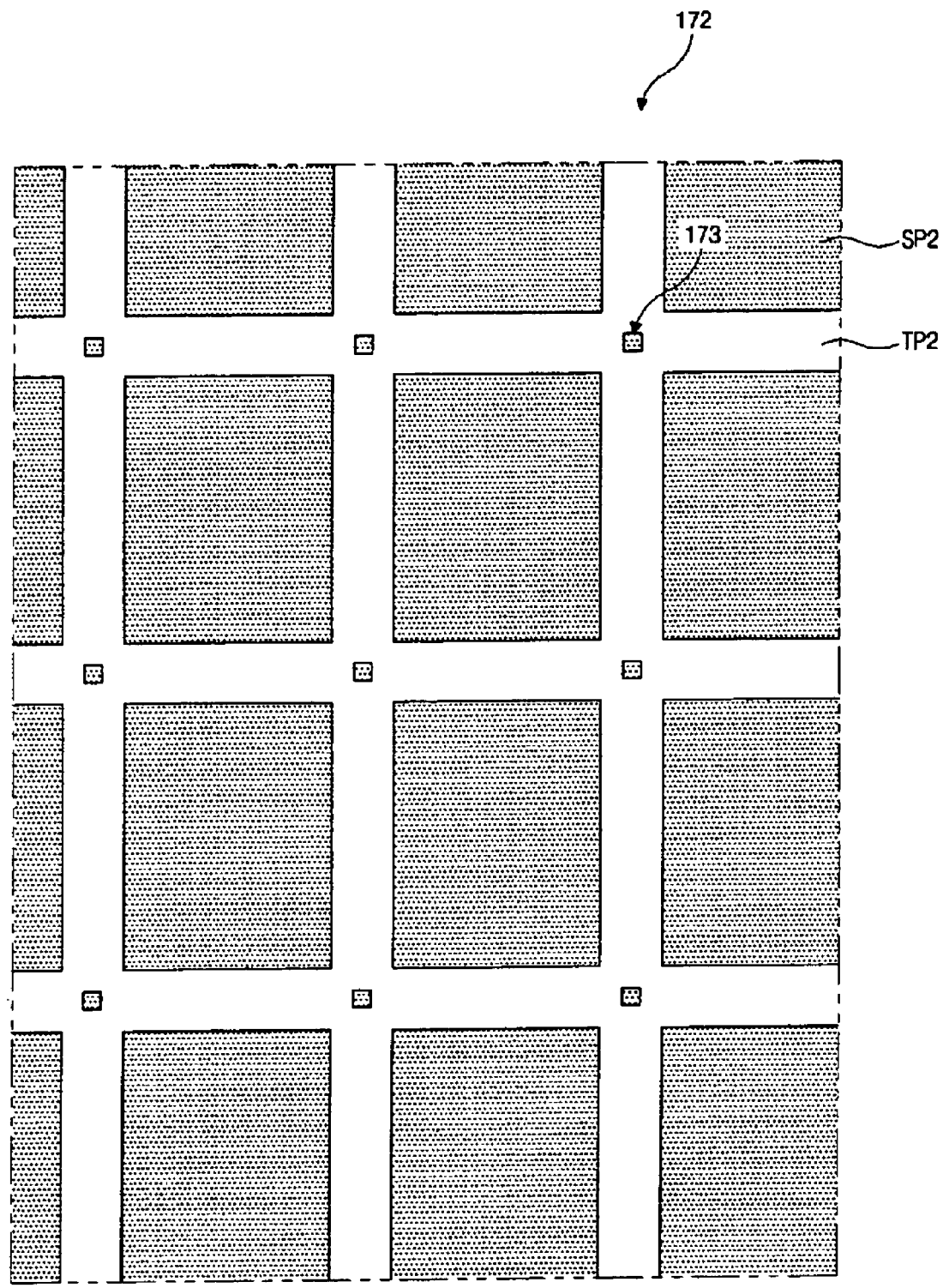
FIG. 6B is a plan view of an exemplary mask applied to a negative type photosensitive material according to an embodiment of the present invention.

FIG. 6B is a plan view of an exemplary mask applied to a negative type photosensitive material according to an embodiment of the present invention. A negative type photosensitive material has a characteristic such that a portion except the exposed region of the negative type photosensitive material is removed through developing. An arrangement of the transmissive portion "TP2" and the shielding portion "SP2" of a mask 172 to form a black matrix using negative type photosensitive material as shown in FIG. 6B is different from the mask 170 depicted in FIG. 6A. Specifically, the transmissive and shielding portions "TP2" and "SP2" are exchanged with the corresponding portions of FIG. 6A.

The shielding portions "SP2" are spaced apart from each other. A transmissive portion "TP2" is located in a boundary region of the shielding portions "SP2." In addition, a plurality of shielding patterns 173 are located in the transmissive portion "TP2" at crossings of the shielding portions "SP2." The shielding portions "SP2" and the shielding patterns 173 may be changed into variable portions and patterns, respectively.

A method of forming the black matrix layer having a positive type photosensitive material will be set forth. When using a negative type photosensitive material, although a property of the photosensitive materials and an arrangement structure of the masks are different from each other, the exposing method principle is similar. Thus, an explanation of the process of forming black matrix layer using the negative photosensitive material will be omitted.

Referring back to FIGS. 3A, 4A and 5A, a method for fabricating a color filter substrate including a black matrix will be set forth hereinafter. In an embodiment of the present invention, the mask 170 of FIG. 6A is applied to the exposing step. The mask 170 is disposed over the substrate 110 and exposes portions of the black matrix material layer 112 deposited on the substrate 110. As shown in FIG. 6A, the mask 170 includes the transmissive portions "TP1," the shielding portions "SP1" and the transmissive holes 171. The mask 170 and the substrate 110 are spaced apart from each other.

The UV light is blocked from being irradiated onto a portion of the black matrix material layer 112 corresponding to the shielding portion "SP1" of the mask 170. Thus, the UV light does not reach the portion of the black matrix material layer 112 corresponding to the shielding portion "SP1" of the mask 170. Accordingly, the UV light is only irradiated onto a portion of the black matrix material layer 112 corresponding to the transmissive portions "TP1" and the transmissive holes 171 of the mask 170. The irradiated portion of the black matrix material layer 112 reacts to the UV light.

Figure 3B:
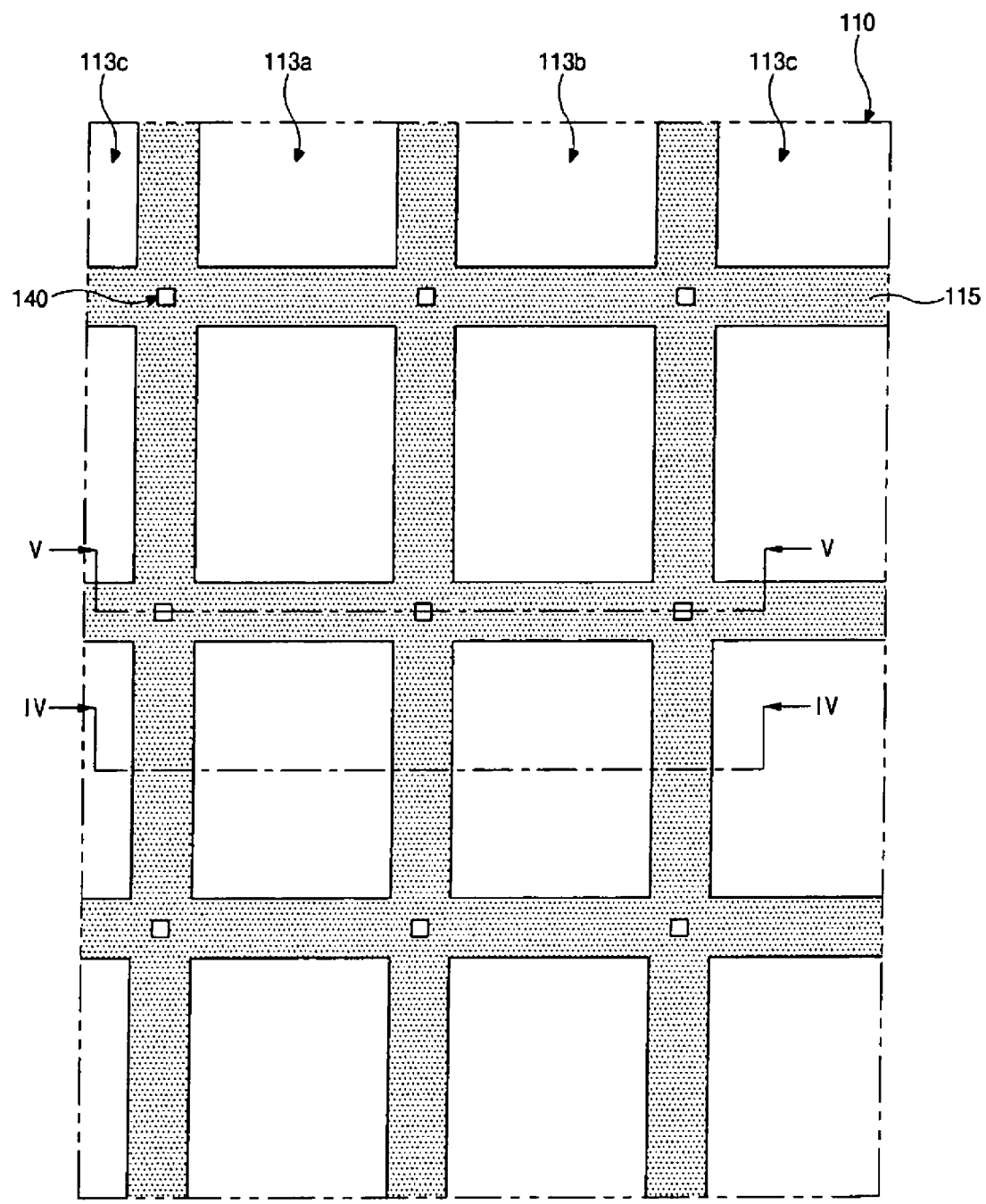
FIG. 3B is a plan view of an exemplary process for exposing and patterning a black matrix layer on a substrate according to an embodiment of the present invention.
Figure 4B:
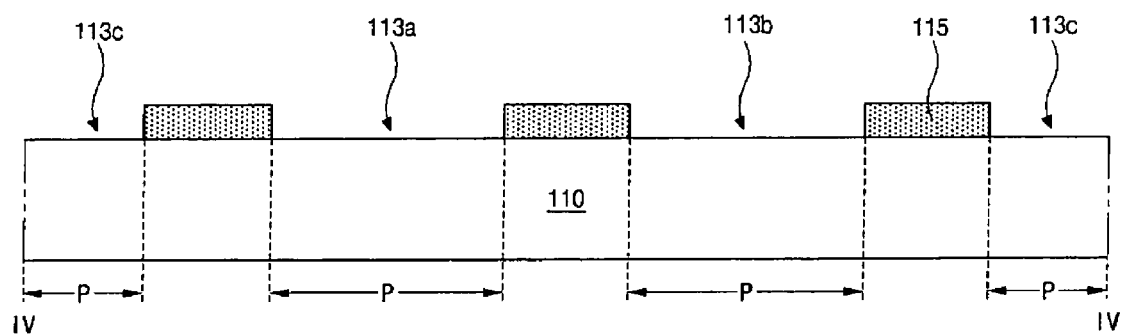
FIG. 4B is a cross-section view taken along a line "IV-IV" of FIG. 3B.
Figure 5B:
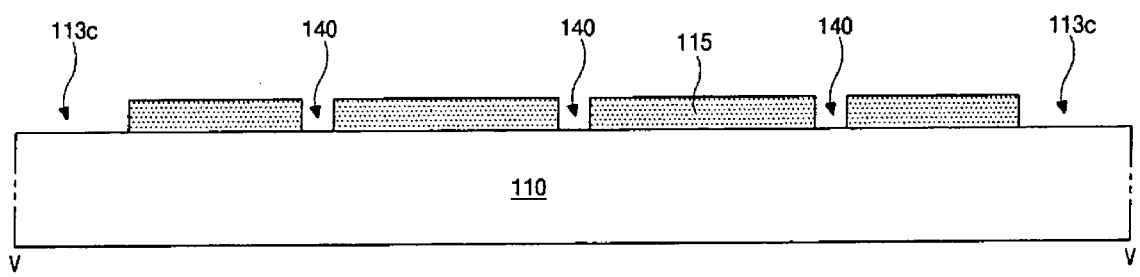
FIG. 5B is a cross-section view taken along a line "V-V" of FIG. 3B.

FIG. 3B is a plan view of an exemplary process for exposing and patterning a black matrix layer on a substrate according to an embodiment of the present invention. FIG. 4B is a cross-section view taken along a line "IV-IV" of FIG. 3B. FIG. 5B is a cross-section view taken along a line "V-V" of FIG. 3B. Referring to FIGS. 3B, 4B and 5B, the black matrix material layer 112 is exposed using the positive type mask 170 (shown in FIG. 6A). The exposed black matrix material layer 112 is developed. A portion of the black matrix material layer 112 corresponding to the transmissive portions "TP1" of the mask 170 shown in FIGS. 4A and 5A is removed by a developer during the developing process. The portion of the black matrix material layer 112 corresponding to the shielding portion "SP1" of the mask 170 is patterned into a black matrix 115. The black matrix 115 includes first, second and third open portions 113a, 113b and 113c. The open portions 113a, 113b and 113c correspond to the pixel regions "P." The first, second and third open portions 113a, 113b and 113c are sequentially formed on the substrate 110 in the same order.

The black matrix 115 also includes a plurality of holes 140 corresponding to the transmissive holes 171 of the mask 170 shown in FIG. 6A. The holes 140 are located in the boundary region of the pixel regions "P" and expose a portion of the substrate 110. Specifically, the holes 140 are located in the non-pixel region such as the boundary region of the pixel regions "P" at crossings of the open portions 113a, 113b and 113c. The holes 140 may be of various shapes.

Figure 3C:
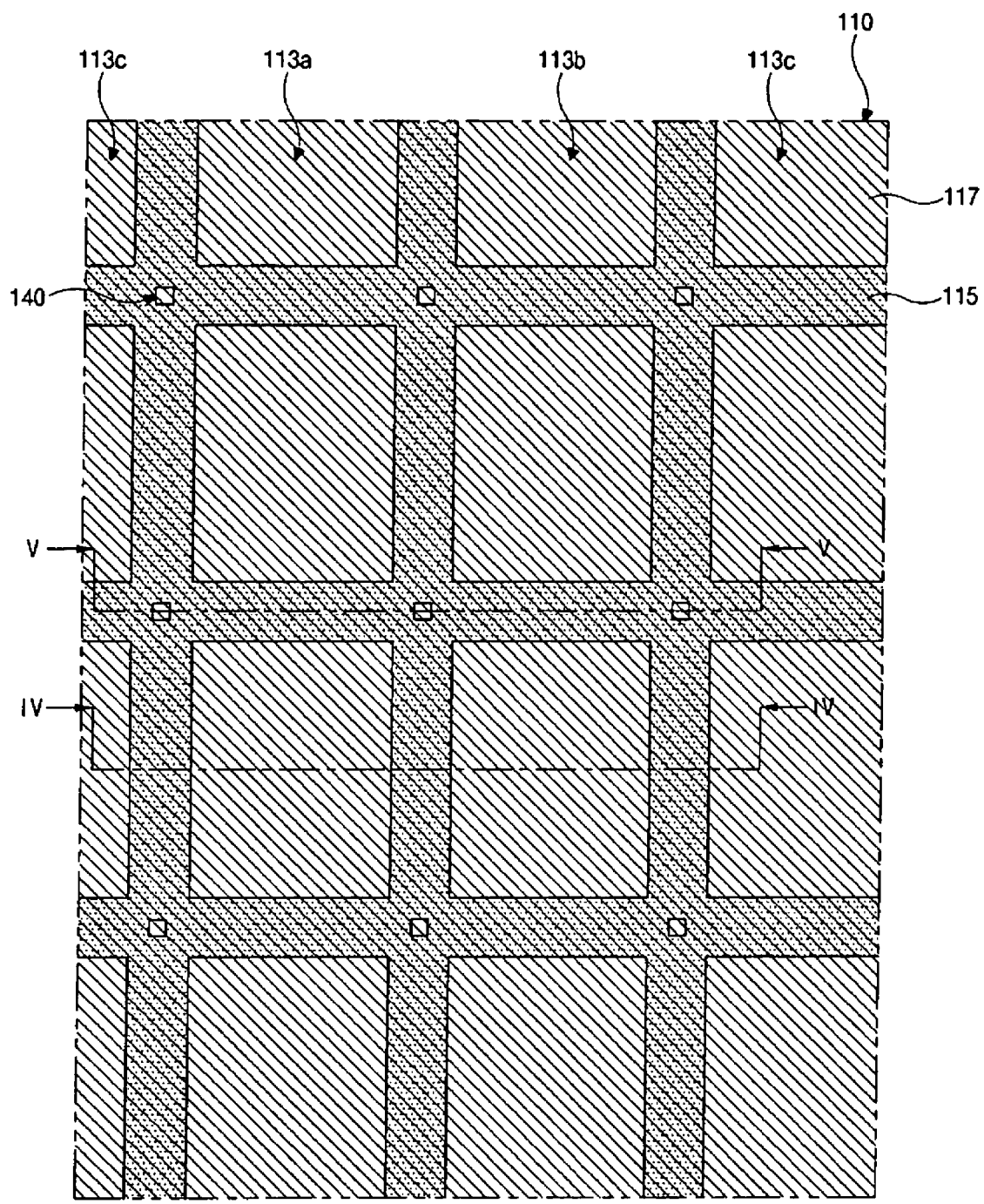
FIG. 3C is a plan view of an exemplary process for depositing a red photoresist layer on a substrate according to an embodiment of the present invention.
Figure 4C:
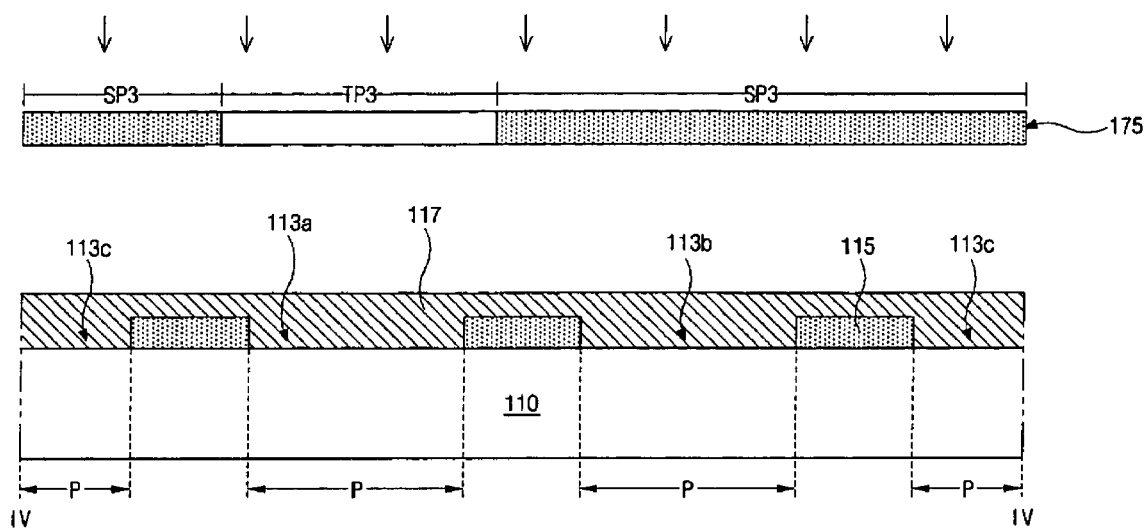
FIG. 4C is a cross-section view taken along a line "IV-IV" of FIG. 3C.
Figure 5C:
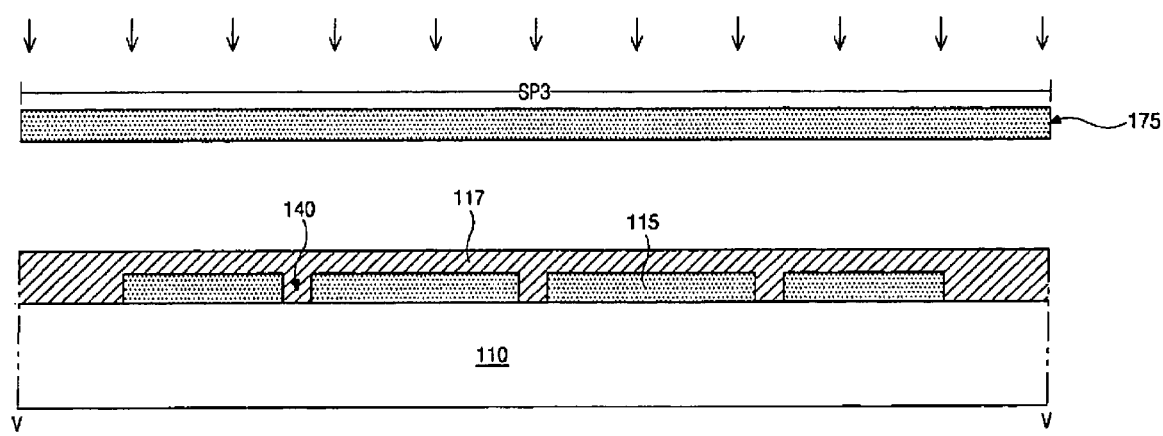
FIG. 5C is a cross-section view taken along a line "V-V" of FIG. 3C.

FIG. 3C is a plan view of an exemplary process for depositing a red photoresist layer on a substrate according to an embodiment of the present invention. FIG. 4C is a cross-section view taken along a line "IV-IV" of FIG. 3C. FIG. 5C is a cross-section view taken along a line "V-V" of FIG. 3C. As shown in FIGS. 3C, 4C and 5C, a red photoresist material 117 is coated over an entire surface of the substrate 110 having the black matrix 115 including the first to third open portions 113a, 113b and 113c, and the holes 140. A mask 175 having a shielding portion "SP3" and transmissive portions "TP3" is disposed over the substrate 110 having the red photoresist layer 117.

The mask 175 includes the transmissive portions "TP3" and the shielding portion "SP3" at a boundary of the transmissive portions "TP3." A later-formed color filter layer according to the embodiment of the present invention includes negative type photoresist material, so the mask 175 is directed to a negative type photosensitive material. Accordingly, the mask 175 should be disposed such that the transmissive portions "TP3" of the mask 175 are disposed in a portion where red color filters will be formed. Then, the red photoresist layer 117 is exposed through the mask 175.

Figure 3D:
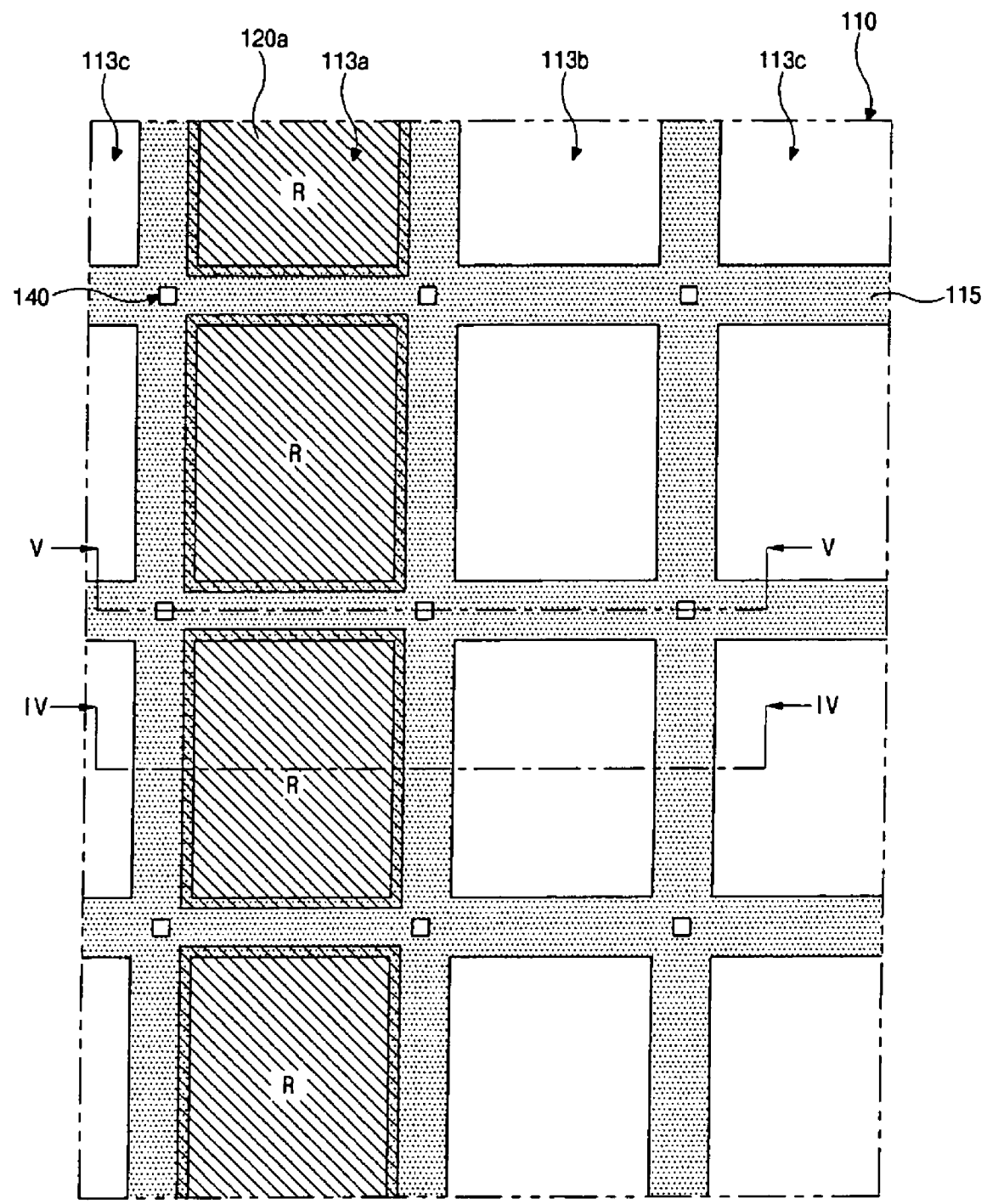
FIG. 3D is a plan view of an exemplary process for forming a red filter on a substrate according to an embodiment of the present invention.
Figure 4D:
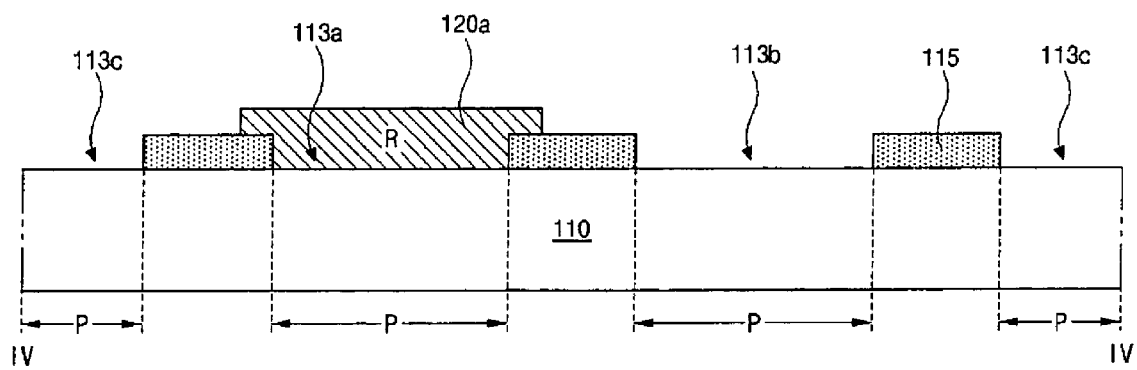
FIG. 4D is a cross-section view taken along a line "IV-IV" of FIG. 3D.
Figure 5D:
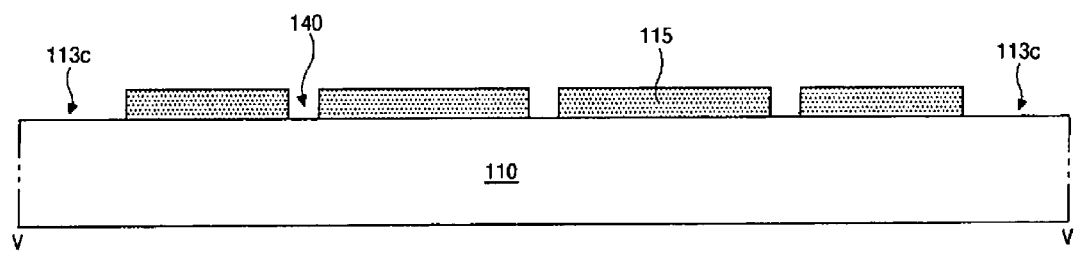
FIG. 5D is a cross-section view taken along a line "V-V" of FIG. 3D.

FIG. 3D is a plan view of an exemplary process for forming a red filter on a substrate according to an embodiment of the present invention. FIG. 4D is a cross-section view taken along a line "IV-IV" of FIG. 3D. FIG. 5D is a cross-section view taken along a line "V-V" of FIG. 3D. As shown in FIGS. 3D, 4D and 5D, by developing the exposed red photoresist layer 117 shown in FIGS. 4C and 5C, a red color filter 120a is formed in the first open portion 113a. The red color filter 120a may overlap with edges of the adjacent black matrix 115.

Figure 3E:
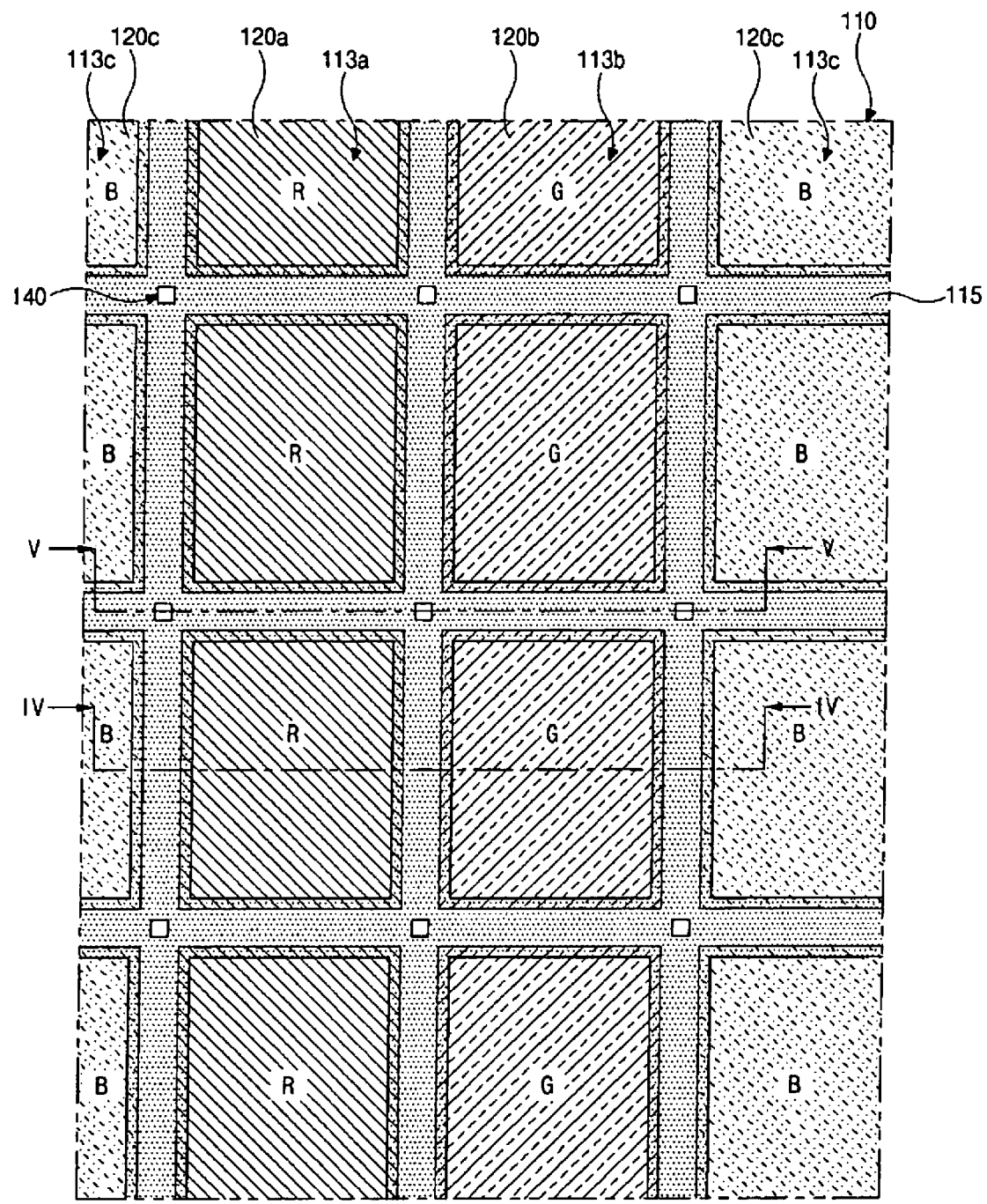
FIG. 3E is a plan view of an exemplary process for forming green and blue filters on a substrate according to an embodiment of the present invention.
Figure 4E:
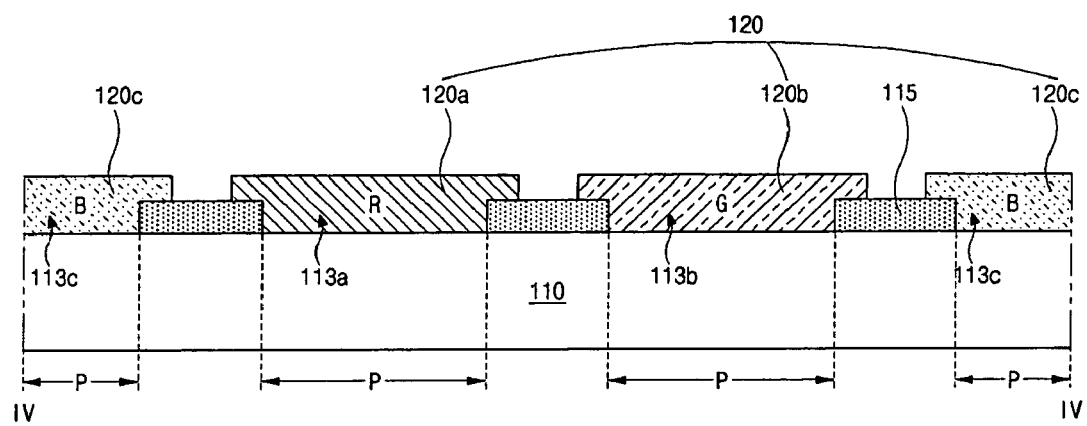
FIG. 4E is a cross-section view taken along a line "IV-IV" of FIG. 3E.
Figure 5E:
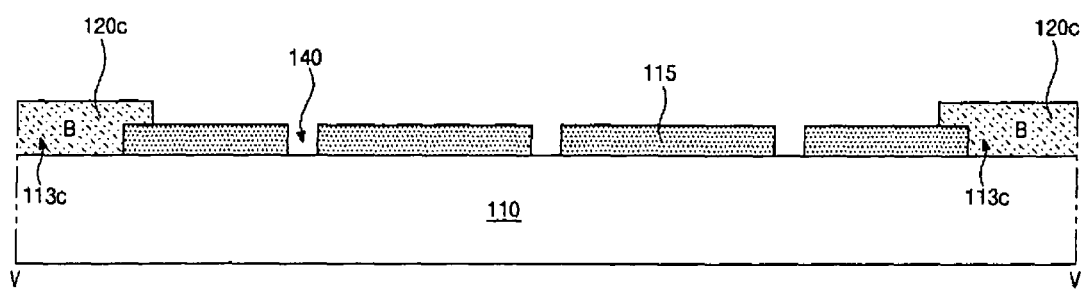
FIG. 5E is a cross-section view taken along a line "V-V" of FIG. 3E.

FIG. 3E is a plan view of an exemplary process for forming green and blue filters on a substrate according to an embodiment of the present invention. FIG. 4E is a cross-section view taken along a line "IV-IV" of FIG. 3E. FIG. 5E is a cross-section view taken along a line "V-V" of FIG. 3E. As shown in FIGS. 3E, 4E and 5E, green and blue color filters 120b and 120c are formed, respectively, in the second and third open portions 113b and 113c using a method similar to the one used for the red color filter 120a. Accordingly, the red, green and blue color filters 120a, 120b and 120c constitute a color filter layer 120. As shown in FIG. 5E, the red, green and blue photoresist materials (not shown) are removed through a developing process in a portion of the transmissive hole 140. Thus, a portion of the substrate 110 is exposed by the transmissive hole 140.

Figure 4F:
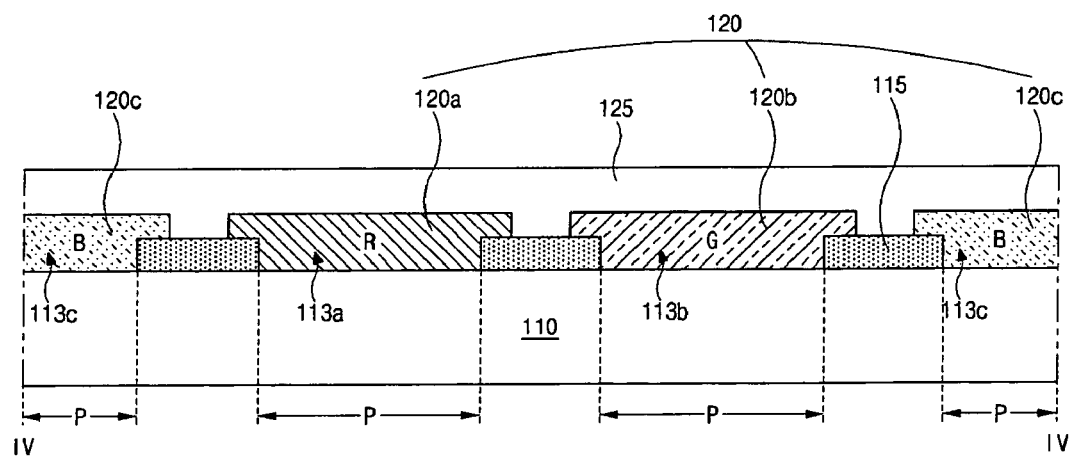
FIG. 4F is a cross-section view illustrating a process for forming an overcoat layer over a substrate according to an embodiment of the present invention.
Figure 5F:
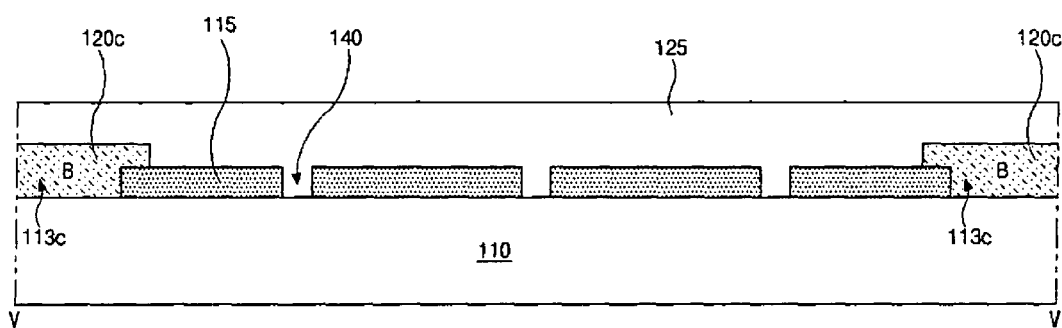
FIG. 5F is a cross-section view illustrating a process for forming an overcoat layer over a substrate according to an embodiment of the present invention.

FIG. 4F is a cross-section view illustrating a process for forming an overcoat layer over a substrate. FIG. 5F is a cross-section view illustrating a process for forming an overcoat layer over a substrate. As shown in FIGS. 4F and 5F, an overcoat layer 125 is formed over the substrate 110 including the color filter layer 120 and the black matrix 115. The overcoat layer 125 protects the color filter layer 120 and planarizes a surface of the substrate 110. The overcoat layer 125 may include a resin material which may be a transparent colorless material. Forming the overcoat layer 125 may include a mask process (not shown) such as a photolithography in order to harden and to pattern the overcoat layer 125.

Figure 4G:
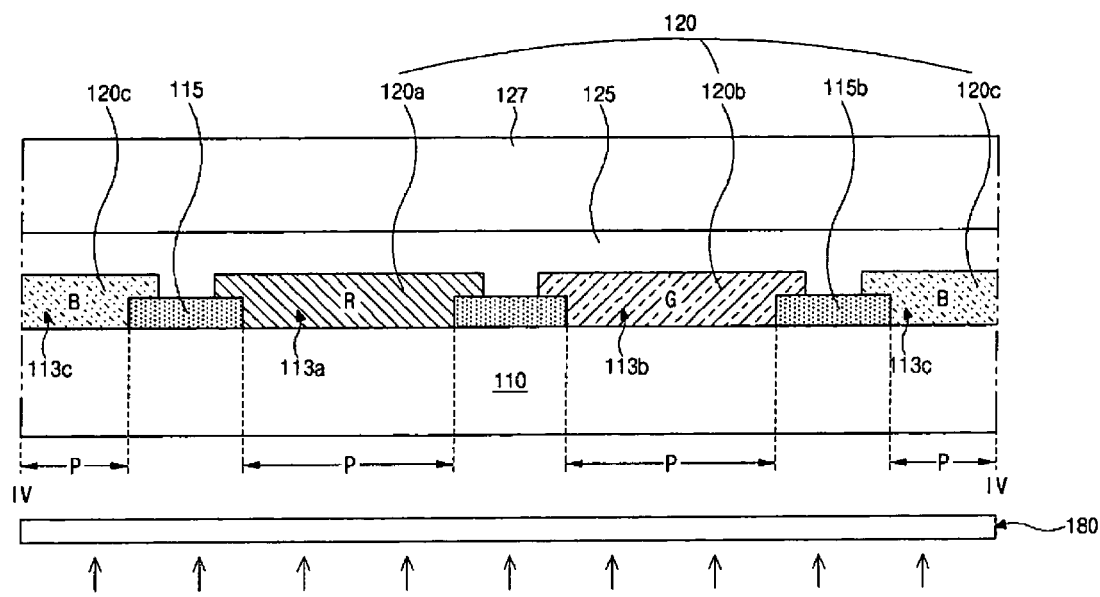
FIG. 4G is a cross-section view illustrating a process for forming a spacer layer over a substrate according to an embodiment of the present invention.
Figure 5G:
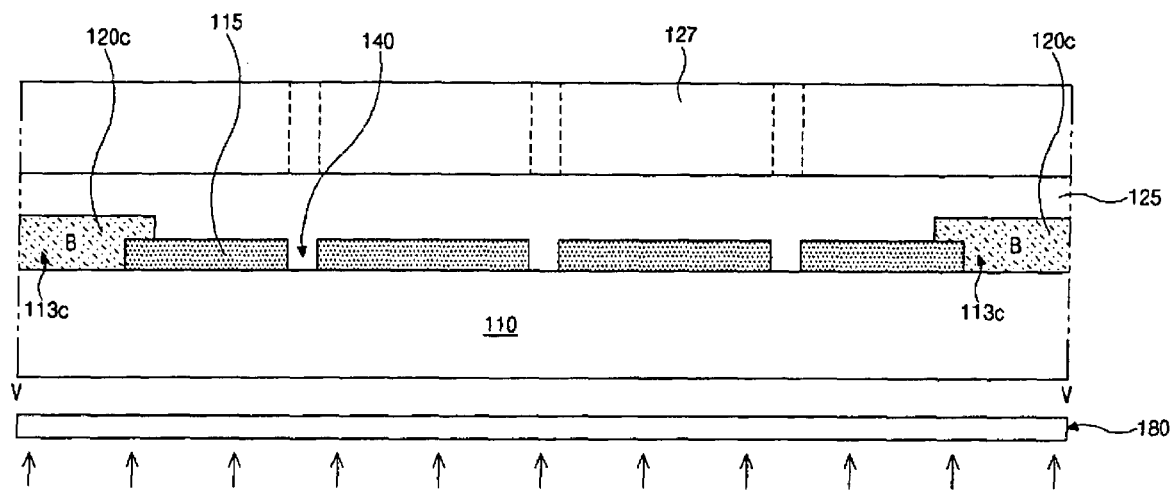
FIG. 5G is a cross-section view illustrating a process for forming a spacer layer over a substrate according to an embodiment of the present invention.

FIG. 4G is a cross-section view illustrating a process for forming a spacer layer over a substrate. FIG. 5G is a cross-section view illustrating a process for forming a spacer layer over a substrate. As shown in FIGS. 4G and 5G, a spacer material layer 127 is formed on the overcoat layer 125 by coating a photosensitive material. According to an embodiment of the present invention, the photosensitive material may be of a negative type.

The spacer material layer 127 includes a photosensitive material having a light blocking property in order to prevent a light leakage phenomenon. A later-formed patterned spacer using the spacer material layer 127 is located at the transmissive hole 140 without additional blocking means in the non-pixel region, such as the boundary region of the pixel regions "P." For example, the spacer material layer 127 may include a type of black pigment material.

A viscosity of the photosensitive material of the spacer material layer 127 is higher than that of the overcoat layer 125. The later-formed patterned spacer preferably is formed within a gap range of 2 to 8 μm. Thus, the spacer material layer 127 should have a low spread property and a high viscosity to be positioned within this thickness range by a coating method.

A common electrode (not shown) may or may not be formed on the color filter substrate 120 depending on a model type of the liquid crystal display device. For example, in an in-plane switching mode liquid crystal display device, the common electrode is not formed on the color filter substrate but on the same substrate as an array element layer. According to an embodiment of the present invention, the liquid crystal display device is an in-plane switching mode liquid crystal display device. Thus, the common electrode is not formed on the color filter substrate. In this instance, the spacer material layer 127 shown in FIGS. 4G and 5G is directly coated on the overcoat layer 125.

However, in other types of liquid crystal display devices, the common electrode may be formed on the overcoat layer 125 using transparent conductive materials, such as indium tin oxide (ITO), indium zinc oxide (IZO) or indium tin zinc oxide (ITZO) before forming the patterned spacer. In addition, if the common electrode is formed on the color filter substrate, the common electrode may be directly formed on the color filter layer without an additional overcoat layer. Thus, when the common electrode is formed on the color filter substrate, the overcoat layer 125 may be omitted on the color filter substrate.

The process for forming a spacer layer shown in FIGS. 4G and 5G may include exposing the back of the substrate 110 including the spacer material layer 127 using an interference filter 180. The interference filter 180 can transmit ultra violet (UV) light having a specific wavelength range. In general, a proximity exposing method is used for fabricating a color filter substrate in order to reduce an exposing time. The proximity exposing method includes irradiating parallel UV light onto the substrate 110 including the spacer material layer 127. The parallel UV light can be provided through a mirror and a mask.

Figure 7:
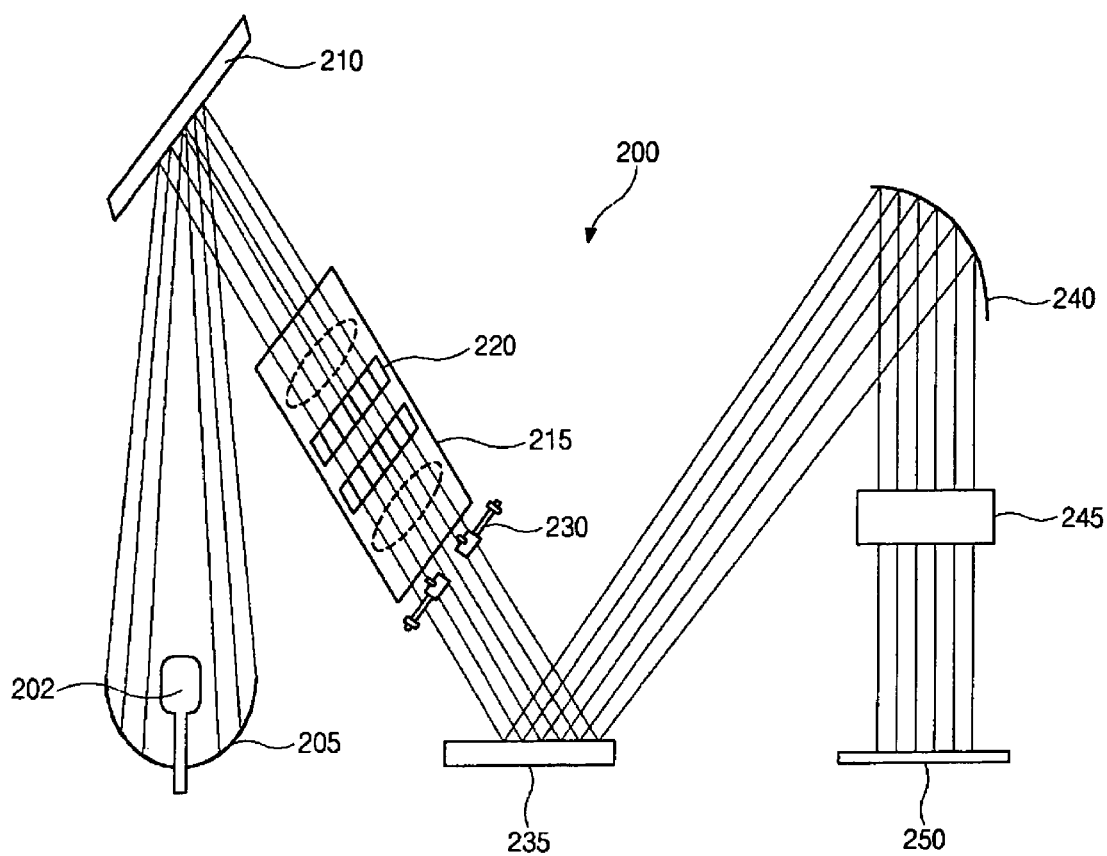
FIG. 7 is a schematic view of an exemplary exposing apparatus having an interference filter according to an embodiment of the present invention.

FIG. 7 is a schematic view of an exemplary exposing apparatus having an interference filter according to an embodiment of the present invention. As shown in FIG. 7, a proximity type exposing apparatus 200 includes a light source 202, an integrator 215, and an interference filter 245. The integrator 215 integrates light from the light source 202. The interference filter 245 transmits light having a specific range of wavelengths from the light emitted by the light source 202.

The proximity type exposing apparatus 200 also includes a first elliptic mirror 205, a first plane mirror 210, a shutter 230, a second plane mirror 235, and a second elliptic mirror 240. The first elliptic mirror 205 collects light from the light source 205 to the first plane mirror 210. The first plane mirror 210 reflects the light from the light source 202 along a specific direction toward the integrator 215. The shutter 230 controls the light supply. The second plane mirror 235 reflects the reflected light from the first plane mirror 210 along a specific direction toward the second elliptic mirror 240. The second elliptic mirror 240 reflects the reflected light from the second plane mirror 235 to the interference filter 245.

The integrator 215 includes a lens 220 disposed in parallel to the reflected light direction from the first plane mirror 210. The light passing through the interference filter 245 is irradiated onto a substrate 250 on a stage (not shown) used in the proximity type exposing apparatus 200. In the proximity type exposing apparatus, no mask is required for irradiating the light filtered by the interference filter 245 onto the substrate 250.

Figure 8:
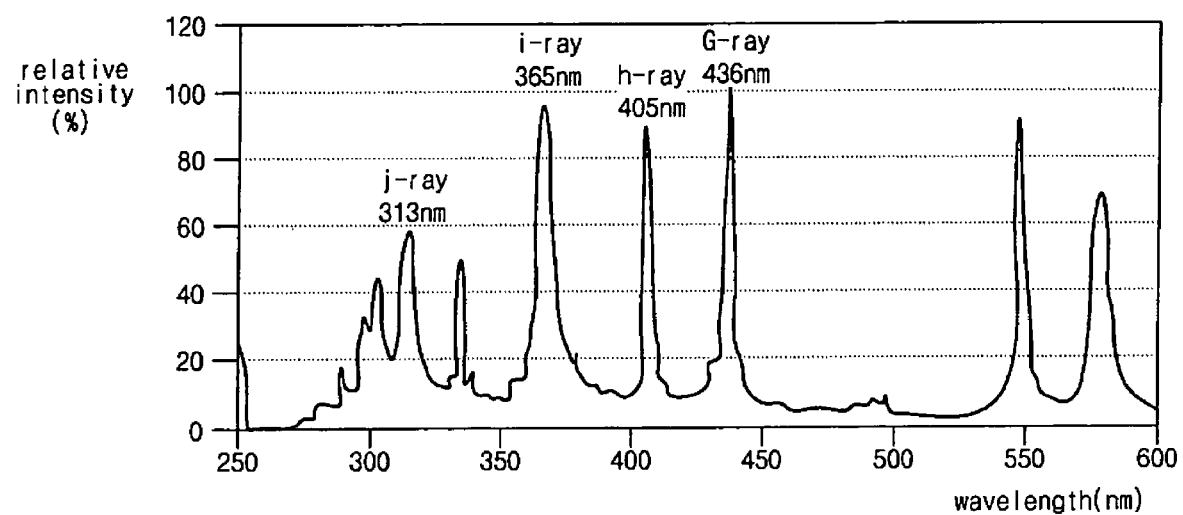
FIG. 8 is a graph illustrating a spectrum range of irradiated light by a general exposing apparatus.

FIG. 8 is a graph illustrating a spectrum range of irradiated light by a general exposing apparatus. As shown in FIG. 8, UV light irradiated onto a substrate by a proximity type exposing apparatus through a mask has a spectral range having a plurality of wavelength ranges such that j-ray, i-ray, h-ray and G-ray. The wavelength ranges j-ray, i-ray, h-ray and G-ray have central wavelengths of about 313 nm, 365 nm, 405 nm and 436 nm according to an energy density, respectively. Only a specific wavelength capable of photo-initiating the photosensitive material is necessary among these wavelength ranges. According to an embodiment of the present invention, the specific wavelength is limited to the i-ray having about 313 nm as the central wavelength.

In general, a photosensitive material includes three basic components, such as a solvent, a polymer material, and a sensitizer capable of causing chemical reaction, such as a decomposition by a light energy. The sensitizer reacts well with the UV light having the specific wavelength. By irradiating only this UV light having the specific wavelength onto the sensitizer, unnecessary photo-reaction caused by extraneous UV light having other wavelength ranges can be reduced, thereby reducing a distortion in the shape of the patterned spacer. Moreover, according to an embodiment of present invention, the patterned spacer can be formed without interposing a mask since the exposure process is performed through the interference filter transmitting UV light of the specific wavelength.

Figure 9:
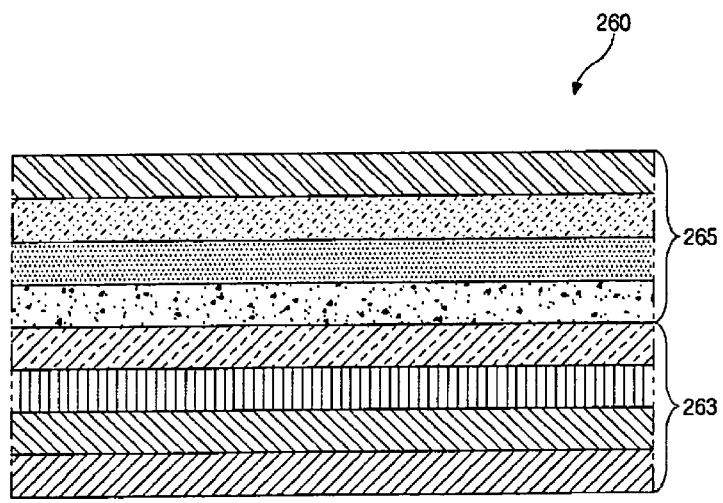
FIG. 9 is a cross sectional view of an exemplary interference filter used a process of exposing according to an embodiment of the present invention.

FIG. 9 is a cross sectional view of an exemplary interference filter used a process of exposing according to an embodiment of the present invention. As shown in FIG. 9, an interference filter 260 includes a first layer group 263 and a second layer group 265. The first layer group 263 includes a plurality of materials to remove unnecessary light of short wavelengths. The second layer group 265 includes a plurality of materials to block unnecessary light of long wavelengths for filtering a specific wavelength. The second layer group 265 is located on the first layer group 263.

Referring back to FIG. 7, when the UV light having various ranges of wavelength from the light source 202 is irradiated onto the substrate 250 through the interference filter 245, the extraneous UV light is almost completely removed through the interference filter 245. Thus, the UV light reaching the substrate 250 is UV light that can react well with the sensitizer of the photosensitive material, such as the spacer material layer 127 shown in FIGS. 4G and 5G.

Figure 10:
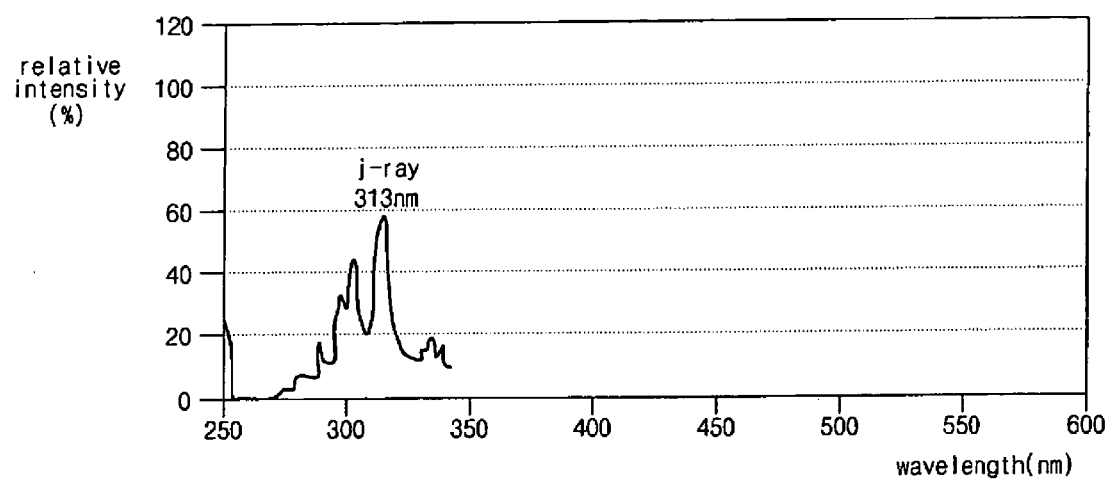
FIG. 10 is a graph illustrating an exemplary spectral range of UV light irradiated through the interference filter depicted in FIG. 9.

FIG. 10 is a graph illustrating an exemplary spectral range of UV light irradiated through the interference filter depicted in FIG. 9. As shown in FIG. 10 in comparison with FIG. 8, most wavelength ranges are removed and only a j-ray (313 nm), which is a UV light having a central wavelength of about 313 nm, reaches a substrate having a spacer material layer for forming a patterned spacer.

Referring back to FIGS. 4G and 5G, the back of the substrate 110 is exposed through the interference filter 180 exemplified by the interference filter 245 shown in FIG. 7. Then, UV light having wavelength ranges other than that of the j-ray is blocked by the interference filter 180 and the j-ray of the specific wavelength range shown in FIG. 10 is irradiated onto the substrate 110.

Referring back to FIGS. 4F, 5F and 9, the j-ray UV light of the specific wavelength range is blocked in a portion of the spacer material layer 127 corresponding to the black matrix 115 and the color filter layer 120 shown in FIGS. 4F and 5F by a blocking property of the black matrix 115 and the color filter layer 120 about the specific wavelength. As discussed above with regard to the first and second layer groups 263 and 265 of the interference filter 260 shown in FIG. 9, the black matrix 115 and the color filter layer 120 can include a photosensitive material capable of blocking the j-ray UV light. Accordingly, only the j-ray L light can pass through the holes 140 of the black matrix 115 that expose a portion of the substrate 110, as shown in FIGS. 4F and 5F. Thus, only the UV light passing the holes 140 is irradiated onto the spacer material layer 127 and cause a reaction with a portion of the spacer material layer 127 corresponding to the holes 140. The i-ray UV light having the specific wavelength range has a good reactivity with regard to the sensitizer (not shown) of the spacer material layer 127.

Figure 4H:
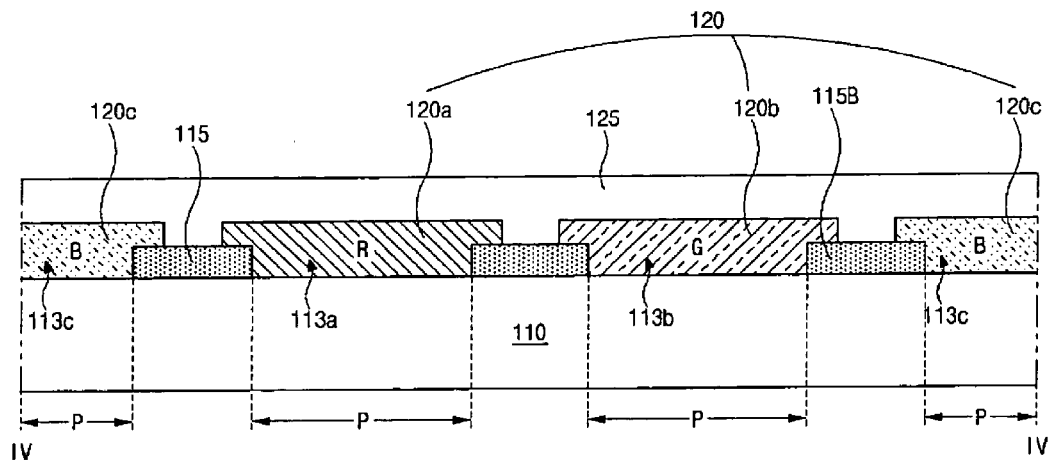
FIG. 4H is a cross-section view of an exemplary patterned spacer over a substrate according to an embodiment of the present invention.
Figure 5H:
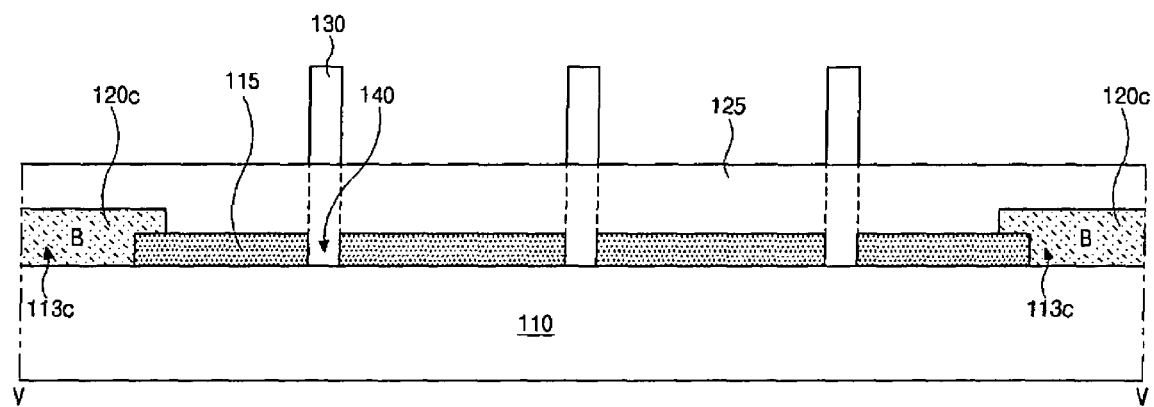
FIG. 5H is an alternate cross-section view of the exemplary patterned spacer shown in FIG. 4H.

FIG. 4H is a cross-section view of an exemplary patterned spacer over a substrate according to an embodiment of the present invention. FIG. 5H is an alternate cross-section view of the exemplary patterned spacer shown in FIG. 4H. As shown in FIG. 5H, a portion of the spacer material layer 127 corresponding to the holes 140 is patterned into a plurality of patterned spacers 130 having pillar shapes in a plan view. In addition, as shown in FIG. 4H, the patterned spacers 130 are not formed along the line 'IV-IV'. The transmissive holes 140 do not incur any shape distortion in a cross section view. Specifically, a portion of the spacer material layer 127 corresponding to the transmissive holes 140 remain after developing the spacer material layer 127. Portions other than the portion of the spacer material layer 127 are almost completely removed. The remaining portion of the spacer material layer 127 acts as the patterned spacers 130.

The location and pitch between the patterned spacers 130 can be controlled during the formation of the transmissive holes 140 of the black matrix 115. Thus, the shape of the patterned spacers 130 can be changed. For example, the patterned spacers 130 may be formed along transverse or columnar directions.

Figure 11:
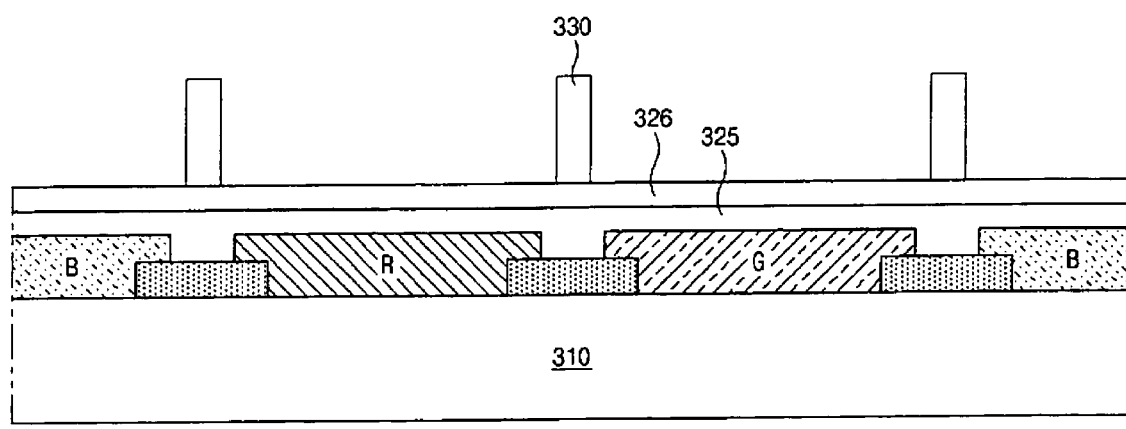
FIG. 11 is a cross sectional view of an exemplary color filter substrate having a patterned spacer and a common electrode according to another embodiment of the present invention.

FIG. 11 is a cross sectional view of an exemplary color filter substrate having a patterned spacer and a common electrode according to another embodiment of the present invention. As shown in FIG. 11, a common electrode 326 is formed between the overcoat layer and the patterned spacer shown in FIGS. 4H and 5H. A process of forming the common electrode 326 includes depositing a transparent conductive material on the entire surface of the overcoat layer 325 after forming the overcoat layer 325. Moreover, the process of forming the common electrode 326 may also include patterning the transparent conductive material by photolithography. The common electrode 326 is formed between the overcoat layer 325 and the pattered spacers 330. However, if the overcoat layer 325 is omitted over a substrate 310, the common electrode 326 may be formed between a color filter layer 320 and the pattered spacers 330.

According to another embodiment of the present invention, the patterned spacers can be formed by an exposing method using interference filter without interposing any mask. Except for the step of forming the common electrode, this embodiment of the present invention can be described in a manner similar to the above discussion with regard to FIGS. 3A to 3E, 4A to 4H and 5A to 5H. Thus, repetitive explanation will be omitted.

According according to embodiment of the present invention, the mask process includes a total of four mask processes, each of which using a separate mask such as forming the black matrix, the red color filter, the green color filter, and the blue color filter. In contrast to the related art, the patterned spacers are formed by an exposing and developing process that do not need a separate mask as described above. Thus, the number of the mask processes is reduced in comparison with the related art. Furthermore, since the number of the mask processes can be reduced, a production cost may be also reduced.

It will be apparent to those skilled in the art that various modifications and variations can be made in embodiments of the liquid crystal display device having patterned spacers and method of fabricating the same of the present invention without departing from the spirit or scope of the invention. Thus, it is intended that the present invention cover the modifications and variations of this invention provided they come within the scope of the appended claims and their equivalents.

What is claimed is:

1. A liquid crystal display device, comprising:
 first and second substrates;
 a black matrix on the second substrate, the black matrix including a plurality of open portions corresponding to pixel regions and a plurality of holes disposed adjacent to the plurality of open portions;
 color filter layers in the open portions of the black matrix;
 an overcoat layer on the color filter layers and filling the holes to transmit light therethrough; and
 a plurality of patterned spacers on the overcoat layer and at positions corresponding to the plurality of holes between the first and the second substrates,
 wherein the plurality of patterned spacers includes a photosensitive material including a sensitizer, and the sensitizer reacts with an UV light of a range having about 313 nm as a central wavelength, and
 wherein the patterned spacers have a viscosity higher than a viscosity of the overcoat layer.

2. The device according to claim 1, wherein the color filter layers include red, green and blue filters in the plurality of open portions.

3. The device according to claim 2, wherein the red, green and blue filters overlap the black matrix.

4. The device according to claim 1, wherein a shape of the plurality of holes includes one of a square shape and a circular shape.

5. The device according to claim 1, further comprising a common electrode between the color filter layers and the plurality of patterned spacers.

6. The device according to claim 1, wherein the overcoat layer includes a transparent colorless material.

* * * * *